United States Patent
Huang et al.

(10) Patent No.: US 7,838,848 B2
(45) Date of Patent: Nov. 23, 2010

(54) PATTERNING DEVICE HOLDING APPARATUS AND APPLICATION THEREOF

(75) Inventors: Hsuan-Bin Huang, Kaohsiung (TW); You-Jin Wang, Milpitas, CA (US); Chung-Shih Pan, Palto Alto, CA (US)

(73) Assignee: Hermes Microvision, Inc., Hsinchu (TW)

(*) Notice: Subject to any disclaimer, the term of this patent is extended or adjusted under 35 U.S.C. 154(b) by 267 days.

(21) Appl. No.: 12/256,828

(22) Filed: Oct. 23, 2008

(65) Prior Publication Data
US 2010/0102226 A1    Apr. 29, 2010

(51) Int. Cl.
*A61N 5/00* (2006.01)
*G21G 5/00* (2006.01)

(52) U.S. Cl. ............ 250/492.2; 250/306; 250/307; 250/310; 250/311; 250/442.11; 250/491.1

(58) Field of Classification Search ............ 250/306, 250/307, 310, 311, 442.11, 491.1, 492.2
See application file for complete search history.

(56) References Cited

U.S. PATENT DOCUMENTS

| 5,357,814 A | 10/1994 | Sugiyama |
| 5,417,589 A | 5/1995 | Terada |
| 2010/0090107 A1* | 4/2010 | Wang et al. .......... 250/307 |
| 2010/0165346 A1* | 7/2010 | Wang et al. .......... 356/445 |

* cited by examiner

*Primary Examiner*—Jack I Berman
*Assistant Examiner*—Meenakshi S Sahu
(74) *Attorney, Agent, or Firm*—Muncy, Geissler, Olds & Lowe, PLLC (57) ABSTRACT

A patterning device holding apparatus includes a support platform unit with a plurality of first positioning projections and a gripper unit. The gripper unit includes a head portion and a plurality of second positioning projections disposed on the head portion, and a rolling member set at a base portion. The grapping and releasing of the patterning device is achieved by the rotation of the gripper unit about a pivot substantially parallel with the center axis of the rolling member. The first and second positioning projections corporately abut against the edges of a patterning device to fix the patterning device in place.

20 Claims, 10 Drawing Sheets

PATTERNING DEVICE HOLDING APPARATUS AND APPLICATION THEREOF

BACKGROUND OF THE INVENTION

1. Field of the Invention

The present invention relates to a patterning device holding apparatus, and more particularly, to a patterning device holding apparatus for a charged particle beam imaging.

2. Background of the Related Art

Improvements in the semiconductor manufacturing technology have allowed for designing and manufacturing of higher density Very Large Scale Integrated (VLSI) circuits and packing more transistors on a given surface area to form a semiconductor device or chip. Increasing transistor density on a given chip has led to the need for method to provide electrically related, higher resolution wafer inspection and defect review. In semiconductor device manufacturing processes, defects may be unintentionally generated during the various stages of semiconductor processing. Thus, it is important to find defects accurately and efficiently as early as possible.

Generally, a process for manufacturing semiconductor devices comprises the operations of forming layers of a variety of materials on or in the substrate of each semiconductor device; lithography, masking and printing circuit patterns on the semiconductor device; and removing or etching portions of the layers to form the semiconductor device. Such semiconductor devices are manufactured by repeating these and other operations on each device of a semiconductor wafer. Better manufacturing techniques have allowed for micro fabrication, resulting in features that are less than 0.1 micron. Examinations of the wafer are made for obtaining defect free devices.

Conventional wafer inspection and/or defect reviewing methods consist of a high magnification and high resolution imaging system, where the wafer or photomask is scanned pixel by pixel by a laser diode. Other wafer examination methods call for the use of optical microscopes. Scanning Electron Microscopes (SEM), as a more advanced microscopic approach, have been used in some defect detection and/or reviewing methods such as critical dimension measurement. With the increasing numbers of transistors packed on a chip, more efficient and more accurate wafer inspection and/or defect reviewing method is desired.

SEM may be used for the inspection and/or defect review of a workpiece having non-circle shapes, for example a parallelogram. Therefore, it is desirable to provide a method and system capable of handling such a workpiece for SEM examination.

SUMMARY OF THE INVENTION

The present invention is directed to a patterning device holding apparatus for the charged particle beam imaging. In embodiments of the present invention, the patterning device is easy to be fixed and released by the design of a gripper unit.

The patterning device holding apparatus for the charged particle beam imaging includes a gripper unit for positioning of a patterning device by rotating about a pivot substantially parallel with the center axis of a rolling member set at the base portion of the gripper unit.

Accordingly, a patterning device holding apparatus is provided for use in charged particle beam imaging. The patterning device holding apparatus comprises a support platform unit and a gripper unit. The support platform unit is configured for supporting a patterning device thereon, and has a plurality of first positioning projections. The gripper unit is configured for fixing the patterning device in place through its rotation about a pivot substantially parallel with the center axis of a rolling member set at a base portion thereof. The gripper unit further comprises a head portion and a plurality of second positioning projections disposed on the head portion. When the patterning device is fixed in place, the plurality of first positioning projections abut against two edges of the patterning device and the plurality of second positioning projections abut against the other two edges of the patterning device.

These and other aspects, features and advantages of the present invention can be further understood from the accompanying drawings and description of preferred embodiments.

DETAILED DESCRIPTION OF THE INVENTION

Figure 1:
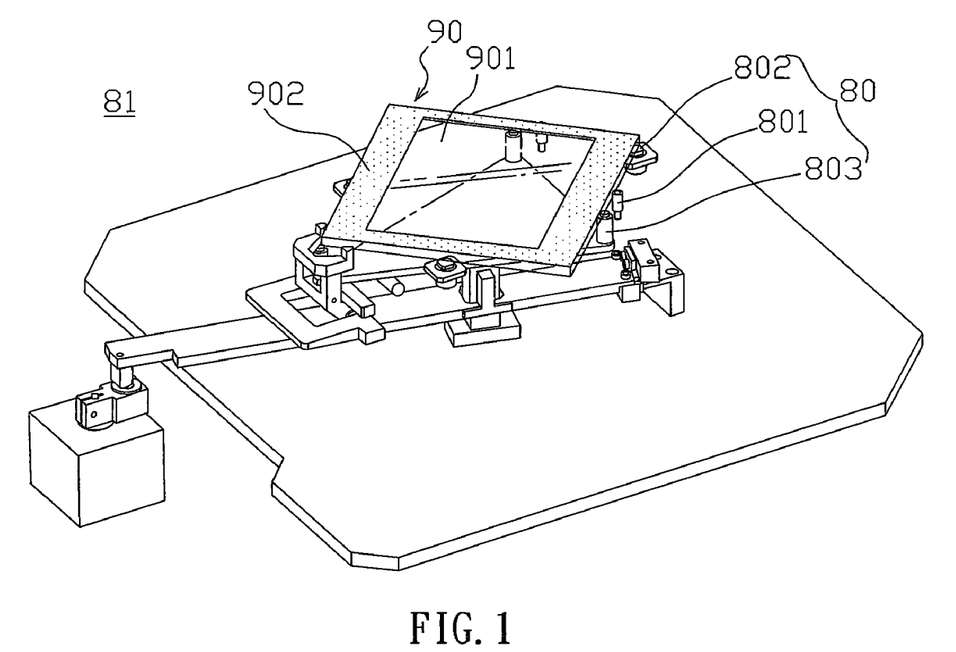
FIG. 1 is a schematic diagram illustrating a patterning device holding apparatus in accordance with one embodiment of the present invention.

FIG. 1 is a schematic diagram illustrating a patterning device holding apparatus in accordance with one embodiment of the present invention. An exemplary patterning device holding apparatus 81 applied to charged particle beam imaging is configured for holding the patterning device 90 which has a patterning area 901 at the center and a margin area 902 surrounding the patterning area 901. The support platform unit 80 of the patterning device holding apparatus 81 is configured for supporting the patterning device 90 thereon and comprises a plurality of first positioning projections 801 for abutting at least one of edges of the patterning device 90. It is understood that the support platform unit 80 further comprises at least one seat 802 under the patterning device 90 for supporting the patterning device 90 by contacting the margin area 902 of the patterning device 90. Furthermore, the support platform unit 80 may comprise a set of lifters 803 for receiving the patterning device 90 from a previous stage of the charged particle beam imaging process, for example, the lifters 803 rise to receive the patterning device 90, and then go down.

Figure 2A:
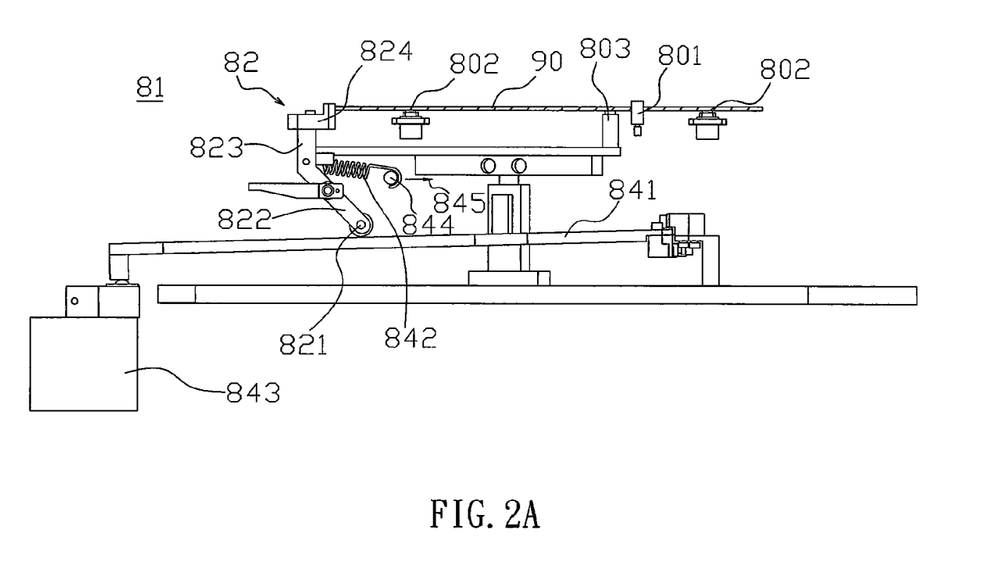
FIG. 2A is a schematic diagram illustrating a patterning device holding apparatus from side view in accordance with one embodiment of the present invention.

FIG. 2A is a schematic diagram illustrating a patterning device holding apparatus 81 from side view in accordance with one embodiment of the present invention. The gripper unit 82 of the patterning device holding apparatus 81 is configured for fixing the patterning device 90 in place. In one example, the gripper unit 82 comprises a base portion 822 and a head portion 823, where the base portion 822 further comprises a rolling member 821, and the head portion 823 further comprises a plurality of second positioning projections 824 disposed thereon. The position alteration of the patterning device, for example but not limited to, being held tight or to be released, is achieved by the rotation of the gripper unit 82 about a pivot substantially parallel with the center axis of the rolling member 821 set at the base portion 822. Accordingly, referring to FIG. 1 and FIG. 2A, in one example, the patterning device 90 in a first position, such as fixed in place, is achieved by abutting the first positioning projections 801 against two edges of the patterning device 90 and the second positioning projections 824 against the other two edges of the patterning device 90. That is, the second positioning projections 824 may, through the rotation of the gripper unit 82, press on the edges of the patterning device 90 pushing the other edges towards or to abut tighter against the first positioning projections 801 so as to keep the patterning device 90 in right position. In another example, the patterning device 90 in a second position such as a loosened-up position ready for removal from the patterning device holding apparatus 81, is achieved by releasing the second positioning projections 824 away from the edges of the patterning device 90, shown as FIG. 2B.

Figure 2B:
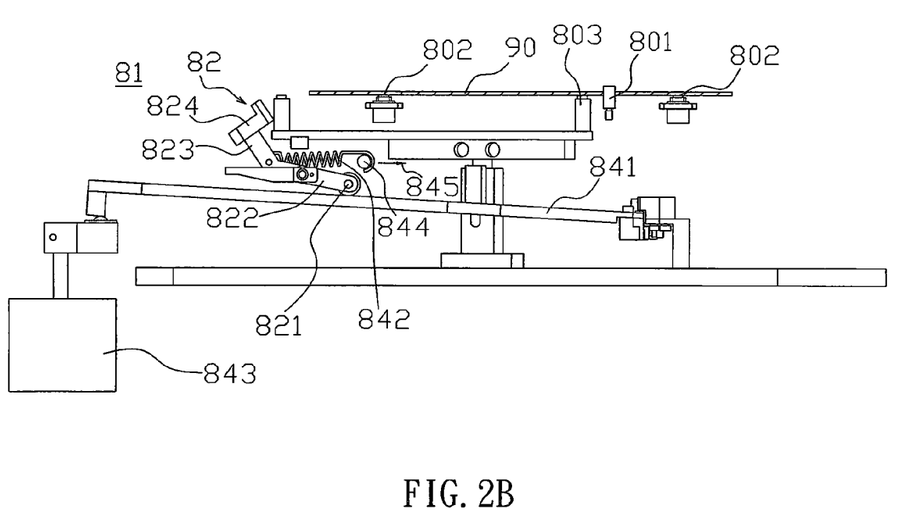
FIG. 2B is a schematic diagram illustrating a patterning device holding apparatus from side view in accordance with one embodiment of the present invention.

As shown in FIG. 2B, the patterning device holding apparatus 81 further comprises a rotation motion provider assembly (841, 842, 843) configured for causing the gripper unit 82 to rotate about the pivot. The rotation motion provider assembly (841, 842, 843) comprises a reciprocating member 841 with one fixed end and one movable end pivoting (refer to U.S. Pat. Nos. 5,417,589, 5,357,814) the fixed end which is attached to a reciprocating motion generator 843, and a resilient member 842. In the example, the rolling member 821 may be in contact with the reciprocating member 841 and roll freely on the surface of the reciprocating member 841. The resilient member 842 is with one end connected to the head portion 823 of the gripper unit 82 and the other end fixed on an arbitrary object 844 as illustrated in FIG. 2A and FIG. 2B, for providing a pulling force to the gripper unit 82 constantly towards a pulling direction illustrated by an arrow 845. The reciprocating motion generator 843 may be, for example but not limited to, air cylinder, liquid cylinder, vacuum producer, motor or spring, and is coupled with the reciprocating member 841 at its movable end. Furthermore, the reciprocating motion generator 843 tilts the reciprocating member 841 by pushing up and pulling down the movable end of the reciprocating member 841 pivoting the fixed end of the reciprocating member 841, which results in the rolling member 821 rolling on the reciprocating member 841. When the rolling member 821 moves substantially along the pulling direction 845, the head portion 823 of the gripper unit 82 moves toward the opposite direction so that the second positioning projections 824 are led away from the edges of the patterning device 90. When the rolling member 821 moves in a direction substantially opposite to the pulling direction 845, the head portion 823 of the gripper unit 82 moves toward the pulling direction 845. The second positioning projections 824 are therefore led towards the edges of the patterning device 90 and in the end to abut against the patterning device 90. When already in contact with the edges of the patterning device 90, the second positioning projections 824 push tighter against the pattering device 90 to hold it fixed in position.

Figure 3A:
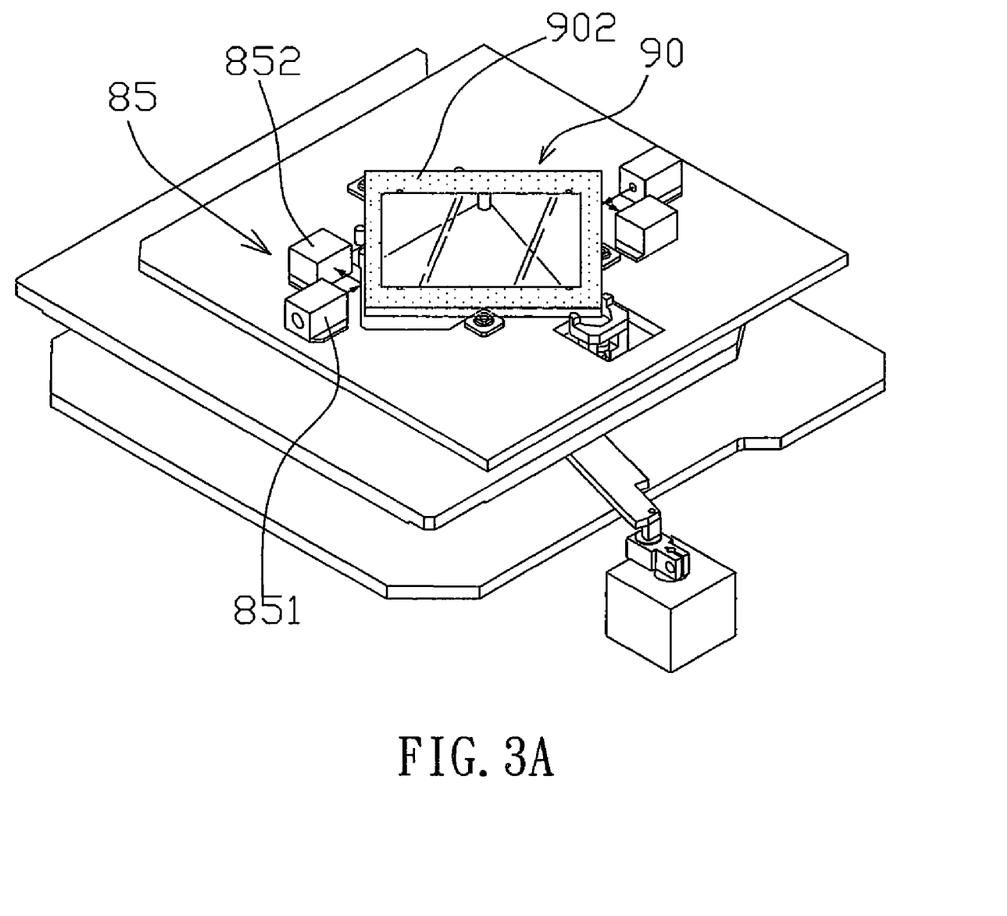
FIG. 3A is a schematic diagram illustrating a patterning device holding apparatus with a position sensor unit in accordance with one embodiment of the present invention.
Figure 3B:
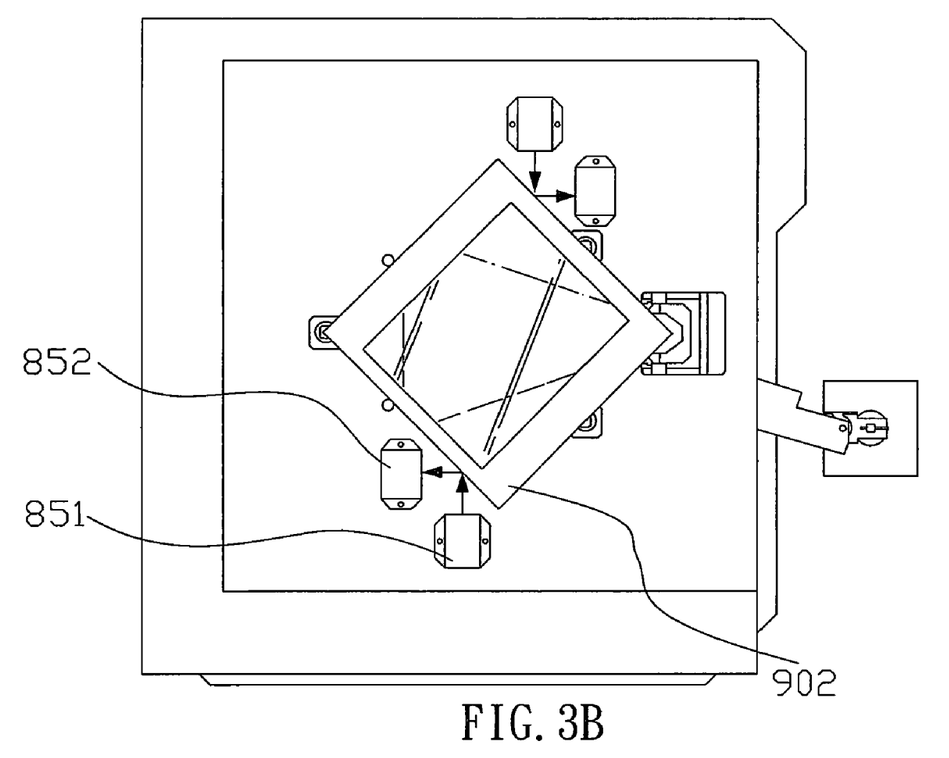
FIG. 3B is a schematic top-view diagram illustrating a patterning device holding apparatus with a position sensor unit in accordance with one embodiment of the present invention.

FIG. 3A is a schematic diagram illustrating a patterning device holding apparatus with a position sensor in accordance with one embodiment of the present invention. FIG. 3B is a schematic diagram illustrating a patterning device holding apparatus with a position sensor from a top view in accordance with one embodiment of the present invention. The patterning device holding apparatus comprises a position sensor unit 85 for determining if the patterning device 90 is correctly in position for imaging. In the example, the position sensor unit 85 comprises a plurality of position detection signal transmitters 851 and receivers 852. In the example, the position detection signal transmitters 851 and receivers 852 are located adjacent to the patterning device 90, for example but not limited to, over, under or on the side of the patterning device 90. As shown in FIGS. 3A and 3B, in one example where the position detection signal transmitters 851 and receivers 852 are located on the side of the patterning device 90, the detecting beam is designed to hit on the side wall facing the position detection signal transmitters 851. The position detection signal receiver 852 is located at a predetermined location to detect correctness of reflection of the position detection signal, so as to determine the translational and/or rotational displacement of the patterning device 90 on a plane perpendicular to that of the patterning device 90. Referring to FIGS. 3C, 3D, 3E and 3F, in other examples of the present invention where the position sensor unit 85 is located under or above the patterning device 90, the hit point is designed to be right outside the margin area 902. Moreover, as illustrated in FIG. 3C to 3F, at least a pair of detecting beams are configured to function simultaneously so that any translational and/or rotational displacement of the patterning device 90 on the plane of the patterning device 90 will inevitably result in the detecting beam hitting on the transparent patterning area of the patterning device 90, causing incorrect reflection of the detecting beam, whereby detection of translational or rotational displacement of the patterning device 90 on the plane of the patterning device 90 is ensured. In summary, the position detection signal transmitter 851 emits a detecting beam, for example but not limited to, UV, IR, laser, supersonic wave, visible or invisible signals, LED light, onto the side walls or the margin area 902 of the patterning device 90 and a reflected detecting beam is detected by the corresponding receiver 852.

Figure 3C:
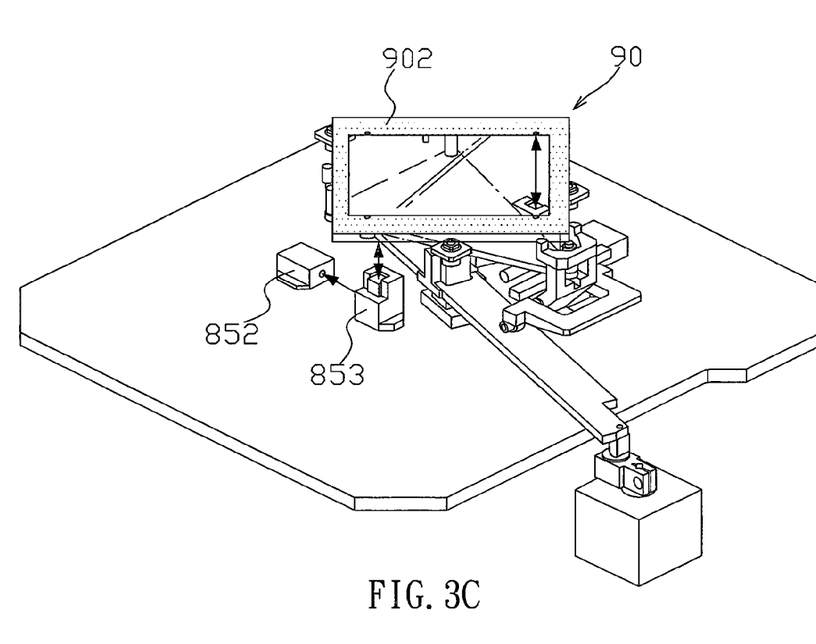
FIG. 3C is a schematic diagram illustrating a patterning device holding apparatus with a position sensor unit in accordance with another embodiment of the present invention.
Figure 3D:
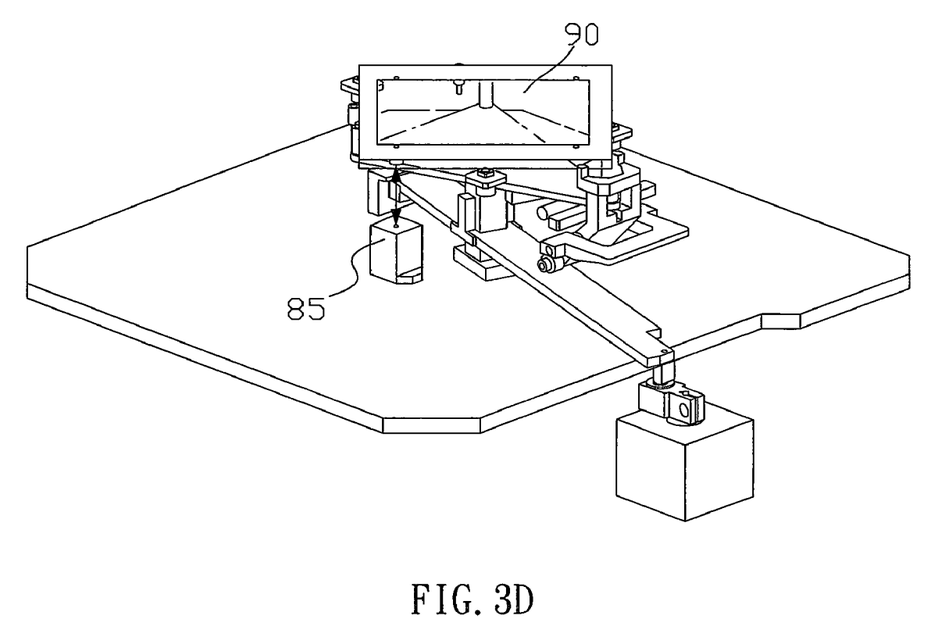
FIG. 3D is a schematic diagram illustrating a patterning device holding apparatus with a position sensor unit in accordance with yet another embodiment of the present invention.
Figure 3E:
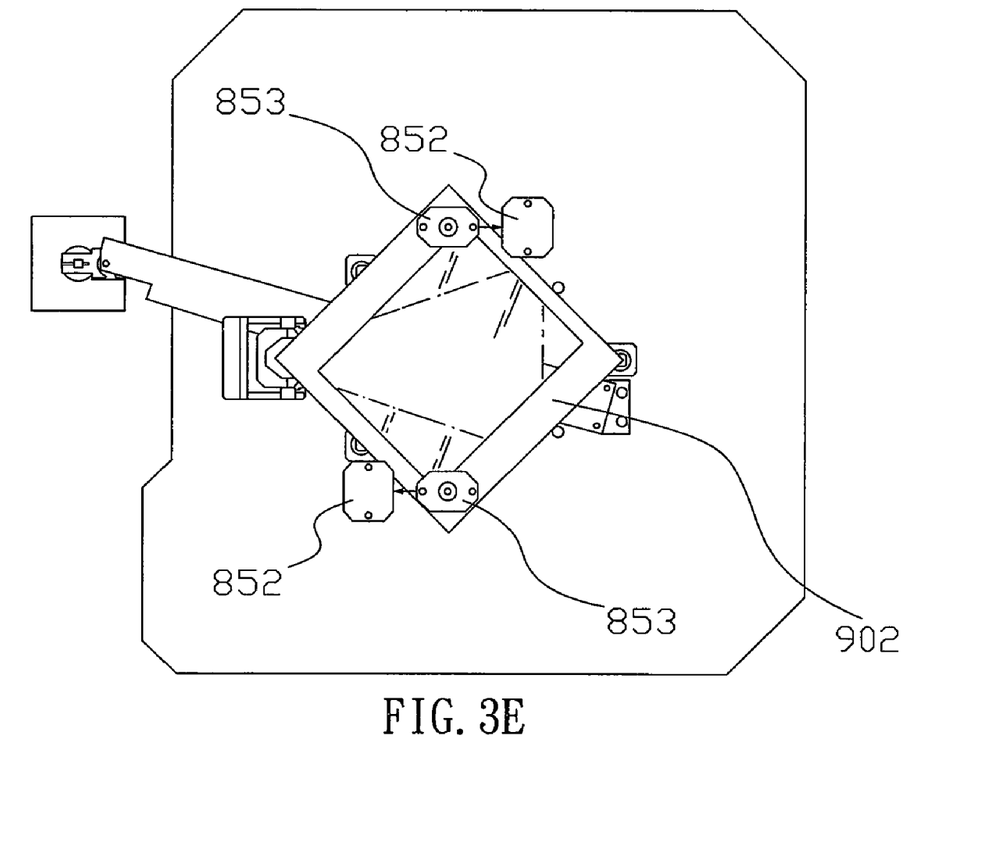
FIG. 3E is a schematic top-view diagram illustrating a patterning device holding apparatus with a top position sensor unit in accordance with one embodiment of the present invention.
Figure 3F:
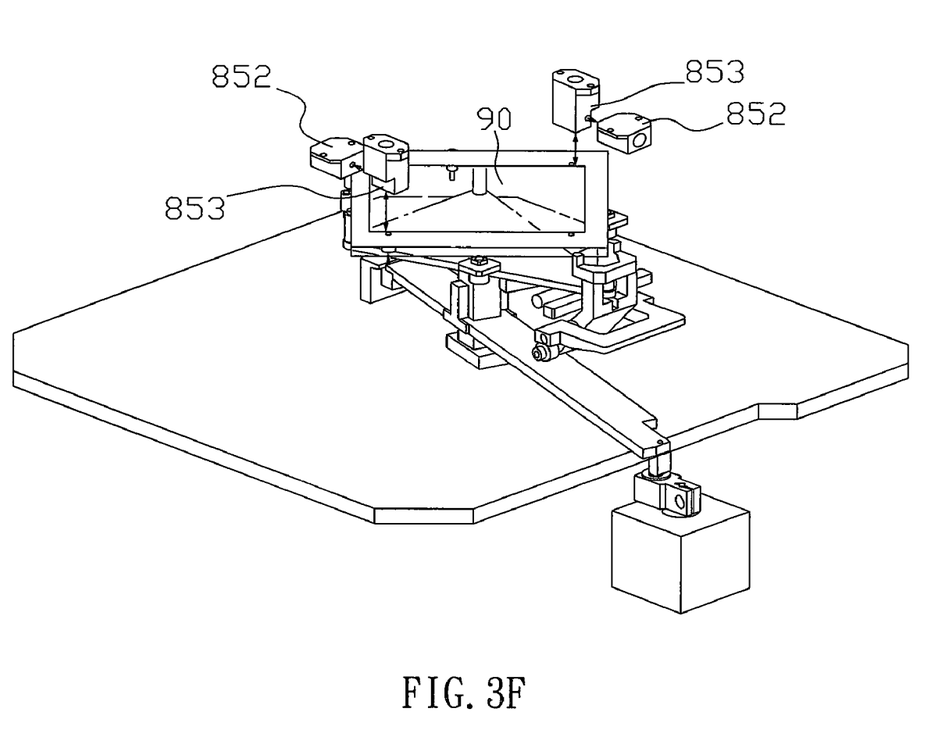
FIG. 3F is a schematic side-view diagram illustrating a patterning device holding apparatus with a top position sensor unit in accordance with one embodiment of the present invention.

As shown in FIG. 3C, the detection signal transmitter 853 may be integrated with a beam splitter for guiding the detecting beam as according to another example of the present invention. In the example, the beam splitter of the detection signal transmitter 853 splits the incident beam from the detection signal source located under the beam splitter and guide the split beam to the margin area 902 of the patterning device 90. The beam splitter may then guide the reflected beam to the corresponding receiver 852. Alternatively, referring to FIG. 3D, in another preferred example the position sensor unit 85 comprises an integrated transmitter/receiver for both emitting and detecting the detecting beam which directly hits on the margin area 902 of the patterning device 90. Referring to FIG. 3E and FIG. 3F, in another embodiment the detection signal transmitter 853 and the receiver 852 are positioned above the patterning device 90. Configurations and functioning of the transmitter 853 and receiver 852 are similar to that described earlier in conjunction of FIG. 3A to 3D and will not be repeated here. In these illustrated embodiments, regardless of the sensor configuration, when the position sensor unit 85 detects strong reflection of the detecting beam from the detected surface of the patterning device 90, it is determined the patterning device 90 is positioned correctly. Then, the position sensor unit 85 outputs a sensor signal that indicates successful positioning of the patterning device 90 to the control unit. Otherwise, the position sensor unit 85 outputs a sensor signal that indicates failed positioning of the patterning device 90. The sensor signal is not limited to be outputted by the position sensor unit 85 but can be outputted by other members of the disclosed patterning device holding apparatus.

Figure 4:
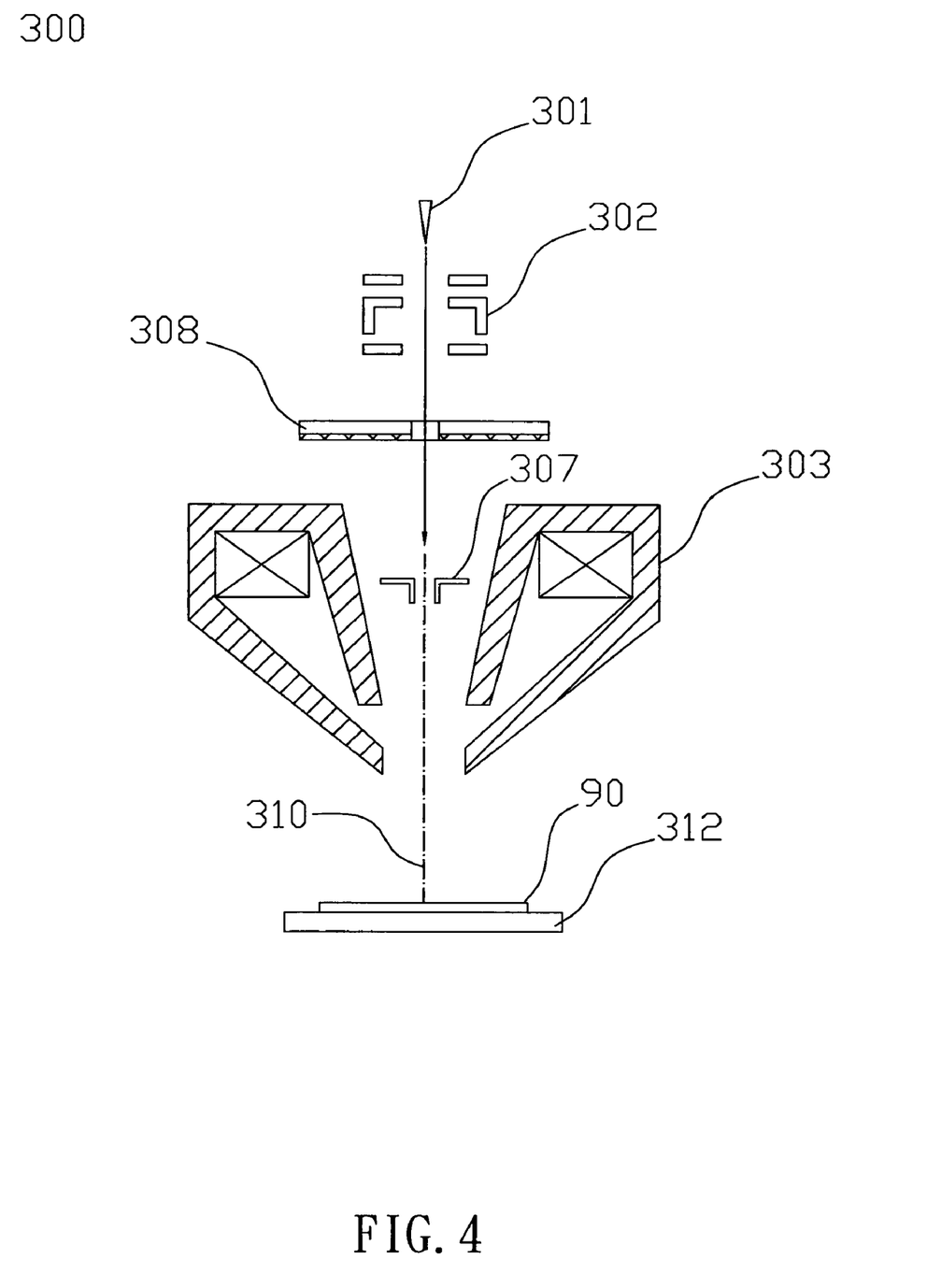
FIG. 4 is a schematic diagram illustrating a scanning electron microscope in accordance with one embodiment of the present invention.

FIG. 4 is a schematic diagram illustrating a scanning electron microscope in accordance with one embodiment of the present invention. An exemplary scanning electron microscope (SEM) 300 includes a charged particle beam generator 301 for generating a primary electron beam 310, a condenser lens module 302 for condensing the primary electron beam 310, a probe forming objective lens module 303 for focusing the primary electron beam 310 into an electron beam probe, an electron beam deflection module 307 for scanning the electron beam probe across the surface of sample (patterning device) 90, a secondary charged particle detector module 308 for detecting secondary electrons along with backscattered electrons from the sample 90 upon being bombarded by the electron beam probe and forming an image of the sample 90 accordingly, and a sample stage 312 for holding the sample 90 thereon during the imaging process. In the example, the support platform unit 80 of the disclosed patterning device holding apparatus (not shown in the figure) may be integrated in the sample stage 312 and is configured for supporting the patterning device 90 thereon for imaging. Accordingly, the exemplary patterning device holding apparatus of the present invention may apply to the scanning electron microscope to program.

Although the present invention has been explained in relation to its preferred embodiment, it is to be understood that other modifications and variation can be made without departing the spirit and scope of the invention as hereafter claimed.

What is claimed is:

1. A patterning device holding apparatus for use in charged particle beam imaging, said patterning device comprising a patterning area at the center and a margin area surrounding said patterning area, comprising:
    a support platform unit for supporting said patterning device thereon, said support platform unit comprising a plurality of first positioning projections;
    a gripper unit for fixing said patterning device in place through rotation of said gripper unit about a pivot substantially parallel with a center axis of a rolling member set at a base portion of said gripper unit, said gripper unit further comprising a head portion and a plurality of second positioning projections disposed on said head portion,
    wherein when said patterning device is fixed in place, said plurality of first positioning projections abut against two edges of said patterning device and said plurality of second positioning projections abut against the other two edges of said patterning device.

2. The patterning device holding apparatus of claim 1, further comprising:
    a rotation motion provider assembly for causing said gripper unit to rotate about said pivot, said rotation motion provider assembly comprising a reciprocating member, a resilient member and a reciprocating motion generator, said reciprocating member comprising a fixed end and a mobile end, said reciprocating member being in contact with said rolling member such that said rolling member rolls freely on a surface of said reciprocating member, said resilient member being fixed at one end and connected to said head portion of said gripper unit at the other end for providing a pulling force to said gripper unit constantly towards a pulling direction, said reciprocating motion generator being connected to said reciprocating member at said mobile end,
    wherein said reciprocating motion generator causes said mobile end of said reciprocating member to perform a reciprocating motion thereby varying the slope of said surface of said reciprocating member, resulting in said rolling member rolling along said surface of said reciprocating member,
    when said rolling member moves in a direction substantially the same as said pulling direction, said head portion of said gripper unit moves in a direction substantially opposite to said pulling direction, leading said plurality of second positioning projections away from said the other edges of said patterning device, and when said rolling member moves in a direction substantially opposite to said pulling direction, said head portion of said gripper unit moves in a direction substantially the same as said pulling direction, leading said plurality of second positioning projections towards or to abut tighter against said the other edges of said patterning device.

3. The patterning device holding apparatus of claim 1, further comprising a position sensor unit for determining the position of said patterning device via detecting interaction of a position detection signal with a surface of said patterning device, and outputting a position sensor signal to a control unit,
    wherein said position sensor unit comprises a plurality of position detection signal transmitters and receivers correspondingly disposed above, under or on the side of said patterning device, with said position detection signal transmitters emitting said position detection signal towards said patterning device, and with said position detection signal receivers receiving said position detection signal reflected by said surface of said patterning device.

4. The patterning device holding apparatus of claim 3, wherein said position sensor unit further comprises a beam splitter for guiding emitted said position detection signal to said surface of said patterning device and to said position detection signal receiver.

5. The patterning device holding apparatus of claim 3, wherein when said position detection signal transmitters and receivers are correspondingly disposed above or under said patterning device, said position detection signal hits said surface of said patterning device at a location right outside said patterning area of said patterning device.

6. The patterning device holding apparatus of claim 3, wherein if said position sensor detects strong reflection of said position detection signal from said detected surface of said patterning device, then it is determined said patterning device is successfully fixed in place by said gripper unit and said position sensor signal is outputted to said control unit indicating the same, otherwise it is determined said patterning device is unsuccessfully fixed in place by said gripper unit and said position sensor signal is outputted to said control unit indicating the same.

7. The patterning device holding apparatus of claim 3, wherein said position detection signal comprises one selected from the group consisting of the following, or any combination thereof: visible light, UV, IR, laser, supersonic wave, visible or invisible signals, LED light.

8. The patterning device holding apparatus of claim 2, wherein said reciprocating motion generator comprises one selected from the group consisting of the following, or any combination thereof: air cylinder, liquid cylinder, vacuum producer, motor, spring.

9. The patterning device holding apparatus of claim 1, wherein said support platform unit further comprises a set of lifters for receiving said patterning device from previous stage of said charged particle beam imaging process and a set of seats for supporting said patterning device through contact at said margin area of said patterning device.

10. The patterning device holding apparatus of claim 1, wherein when said patterning device is fixed in place, said plurality of first positioning projections abut against two neighboring edges of said patterning device and said plurality of second positioning projections abut against the other two neighboring edges of said patterning device.

11. A patterning device imaging system involving charged particle beam imaging, comprising:

a support member for supporting said patterning device thereon;

a charged particle beam generator for generating a primary charged particle beam;

a condenser lens module for condensing generated said primary charged particle beam;

a probe forming objective lens module for focusing condensed said primary charged particle beam into a charged particle beam probe;

a charged particle beam deflection module for scanning said charged particle beam probe across a surface of said patterning device;

a secondary charged particle detector module for detecting secondary charged particles generated from said patterning device surface when being bombarded by said charged particle beam probe; and a patterning device holding apparatus for holding said patterning device on said support member, said patterning device holding apparatus comprising:

a support platform unit for supporting said patterning device thereon, said support platform unit comprising a plurality of first positioning projections;

a gripper unit for fixing said patterning device in place through a rotation motion of said gripper unit about a pivot substantially parallel with a center axis of a rolling member set at a base portion of said gripper unit, said gripper unit further comprising a head portion and a plurality of second positioning projections disposed on said head portion of said gripper unit, wherein when said patterning device is fixed in place, said plurality of first positioning projections abut against two edges of said patterning device and said plurality of second positioning projections abut against the other two edges of said patterning device.

12. The patterning device imaging system of claim 11, further comprising:

a rotation motion provider assembly for causing said gripper unit to rotate about said pivot, said rotation motion provider assembly comprising a reciprocating member, a resilient member and a reciprocating motion generator, said reciprocating member comprising a fixed end and a mobile end, said reciprocating member being in contact with said rolling member such that said rolling member rolls freely on a surface of said reciprocating member, said resilient member being fixed at one end and connected to said head portion of said gripper unit at the other end for providing a pulling force to said gripper unit constantly towards a pulling direction, said reciprocating motion generator being connected to said reciprocating member at said mobile end, wherein said reciprocating motion generator causes said mobile end of said reciprocating member to perform a reciprocating motion thereby varying the slope of said surface of said reciprocating member, resulting in said rolling member rolling along said surface of said reciprocating member, when said rolling member moves in a direction substantially the same as said pulling direction, said head portion of said gripper unit moves in a direction substantially opposite to said pulling direction, leading said plurality of second positioning projections away from said the other edges of said patterning device, and when said rolling member moves in a direction substantially opposite to said pulling direction, said head portion of said gripper unit moves in a direction substantially the same as said pulling direction, leading said plurality of second positioning projections towards or to abut tighter against said the other edges of said patterning device.

13. The patterning device imaging system of claim 11, further comprising a position sensor unit for determining the position of said patterning device via detecting interaction of a position detection signal with a surface of said patterning device, and outputting a position sensor signal to a control unit, wherein said position sensor unit comprises a plurality of position detection signal transmitters and receivers correspondingly disposed above, under or on the side of said patterning device, with said position detection signal transmitters emitting said position detection signal towards said patterning device, and with said position detection signal receivers receiving said position detection signal reflected by said surface of said patterning device.

14. The patterning device imaging system of claim 13, wherein said position sensor unit further comprises a beam splitter for guiding emitted said position detection signal to said surface of said patterning device and to said position detection signal receiver.

15. The patterning device imaging system of claim 13, wherein when said position detection signal transmitters and receivers are correspondingly disposed above or under said patterning device, said position detection signal hits said surface of said patterning device at a location right outside said patterning area of said patterning device.

16. The patterning device imaging system of claim 13, wherein if said position sensor detects strong reflection of said position detection signal from said detected surface of said patterning device, then it is determined said patterning device is successfully fixed in place by said gripper unit and said position sensor signal is outputted to said control unit indicating the same, otherwise it is determined said patterning device is unsuccessfully fixed in place by said gripper unit and said position sensor signal is outputted to said control unit indicating the same.

17. The patterning device imaging system of claim 13, wherein said position detection signal comprises one selected from the group consisting of the following, or any combination thereof: visible light, UV, IR, laser, supersonic wave, visible or invisible signals, LED light.

18. The patterning device imaging system of claim 12, wherein said reciprocating motion generator comprises one selected from the group consisting of the following, or any combination thereof: air cylinder, liquid cylinder, vacuum producer, motor, spring.

19. The patterning device imaging system of claim 11, wherein said support platform unit further comprises a set of lifters for receiving said patterning device from previous stage of said charged particle beam imaging process and a set of seats for supporting said patterning device through contact at said margin area of said patterning device.

20. The patterning device imaging system of claim 11, when said patterning device is fixed in place, said plurality of first positioning projections abut against two neighboring edges of said patterning device and said plurality of second positioning projections abut against the other two neighboring edges of said patterning device.

* * * * *